United States Patent [19]

Whitacre et al.

[11] Patent Number: 4,577,318

[45] Date of Patent: Mar. 18, 1986

[54] SELF TESTING DETECTION SYSTEM FOR COMPARING DIGITAL SIGNAL TRANSITION TIMES

[75] Inventors: James B. Whitacre, Westminster; Peter P. Binoeder, Tustin, both of Calif.

[73] Assignee: Burroughs Corporation, Detroit, Mich.

[21] Appl. No.: 551,081

[22] Filed: Nov. 14, 1983

[51] Int. Cl.[4] ............................................. G01R 15/12
[52] U.S. Cl. ...................................... 371/1; 324/73 R
[58] Field of Search .................... 371/1, 61; 360/6, 51; 340/347 AD, 347 DA; 364/482; 324/73 R, 73 AT

[56] References Cited

U.S. PATENT DOCUMENTS

| | | | |
|---|---|---|---|
| 3,725,685 | 4/1973 | Bourgoin et al. | 364/482 |
| 3,927,392 | 12/1975 | Caron | 371/1 |
| 4,092,589 | 5/1978 | Chau et al. | 371/1 |
| 4,115,759 | 9/1978 | Besenfelder | 371/1 |
| 4,122,995 | 10/1978 | Franke | 371/1 |
| 4,139,147 | 2/1979 | Franke | 371/1 |
| 4,196,475 | 4/1980 | Hall | 364/482 |
| 4,357,702 | 12/1982 | Chare et al. | 371/1 |
| 4,488,297 | 12/1984 | Vaid | 371/1 |
| 4,490,821 | 12/1984 | Lacher | 371/1 |

Primary Examiner—Michael R. Fleming
Attorney, Agent, or Firm—Alfred W. Kozak; Nathan Cass; Kevin R. Peterson

[57] ABSTRACT

A plurality of digital signals from a standard reference digital module are compared with the corresponding digital signals from a comparable module-undergoing-test. A select multiplexor receives the pairs of signals from the source modules and conveys the signal pairs to each of a plurality of skew comparison circuits for analysis and error reporting to a maintenance-controller processor. The select multiplexor also permits an internal self-test generator to check out the skew compare circuitry and also permits a mask register, programmed by the maintenance controller processor, to select only those signal pairs which it is desired to analyze, rather than merely checking all the available pairs of lines in the system.

11 Claims, 7 Drawing Figures

DATA COMPARATOR 500

ADJUSTABLE SKEW COMPARE CIRCUIT

0 = ALLOWABLE SKEW
1 = NON-ALLOWABLE = (ERROR SIGNAL)

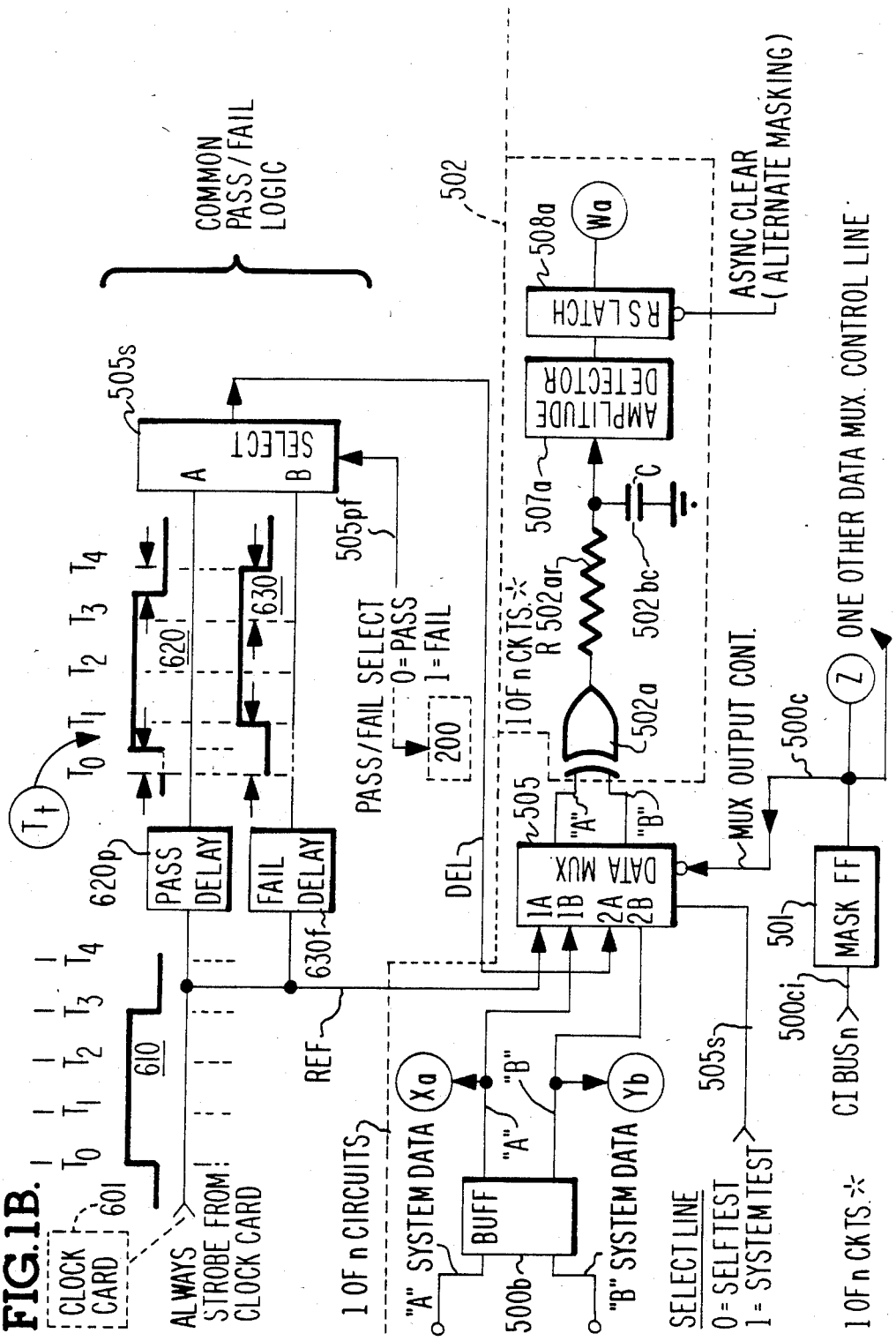

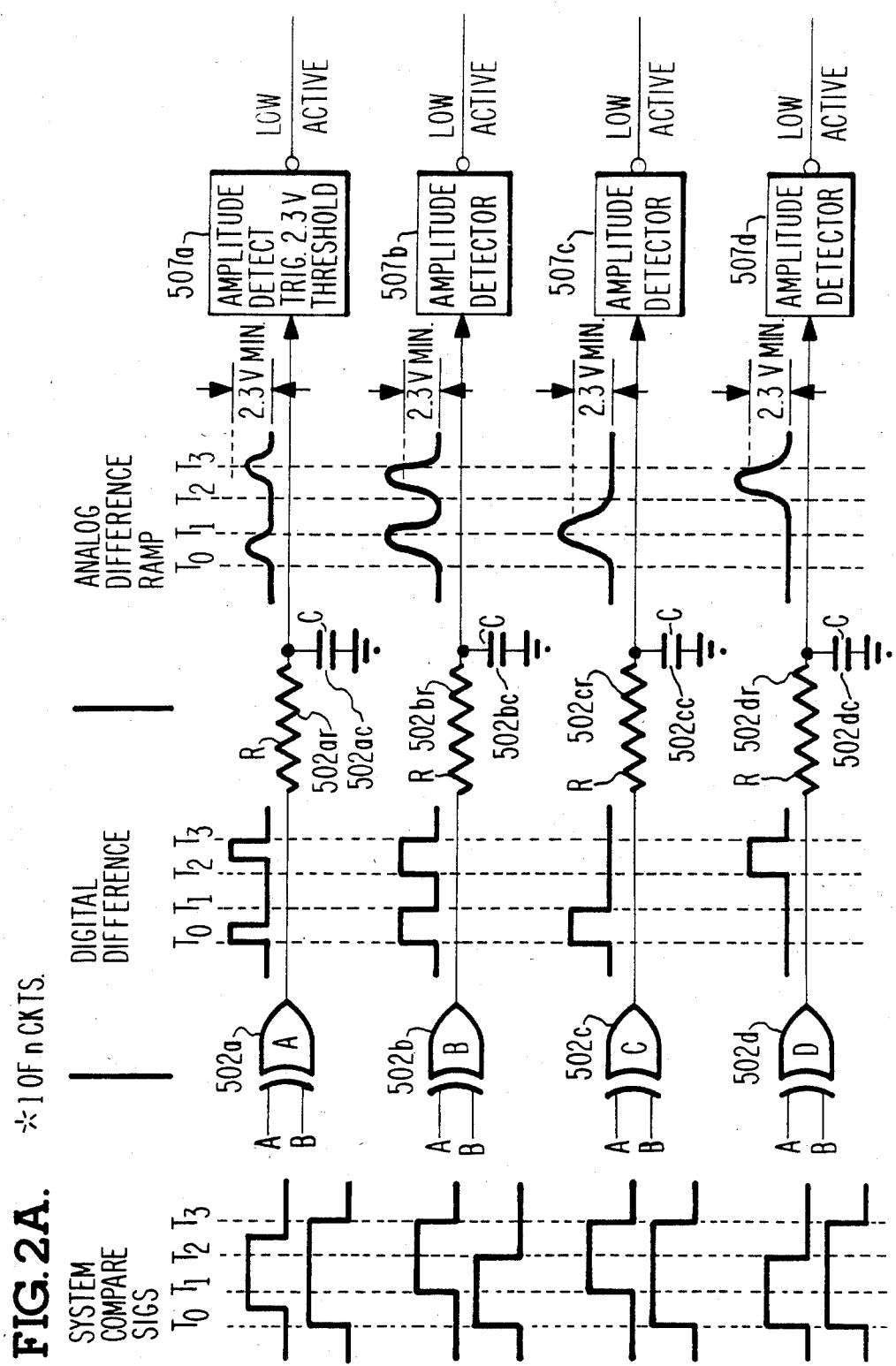

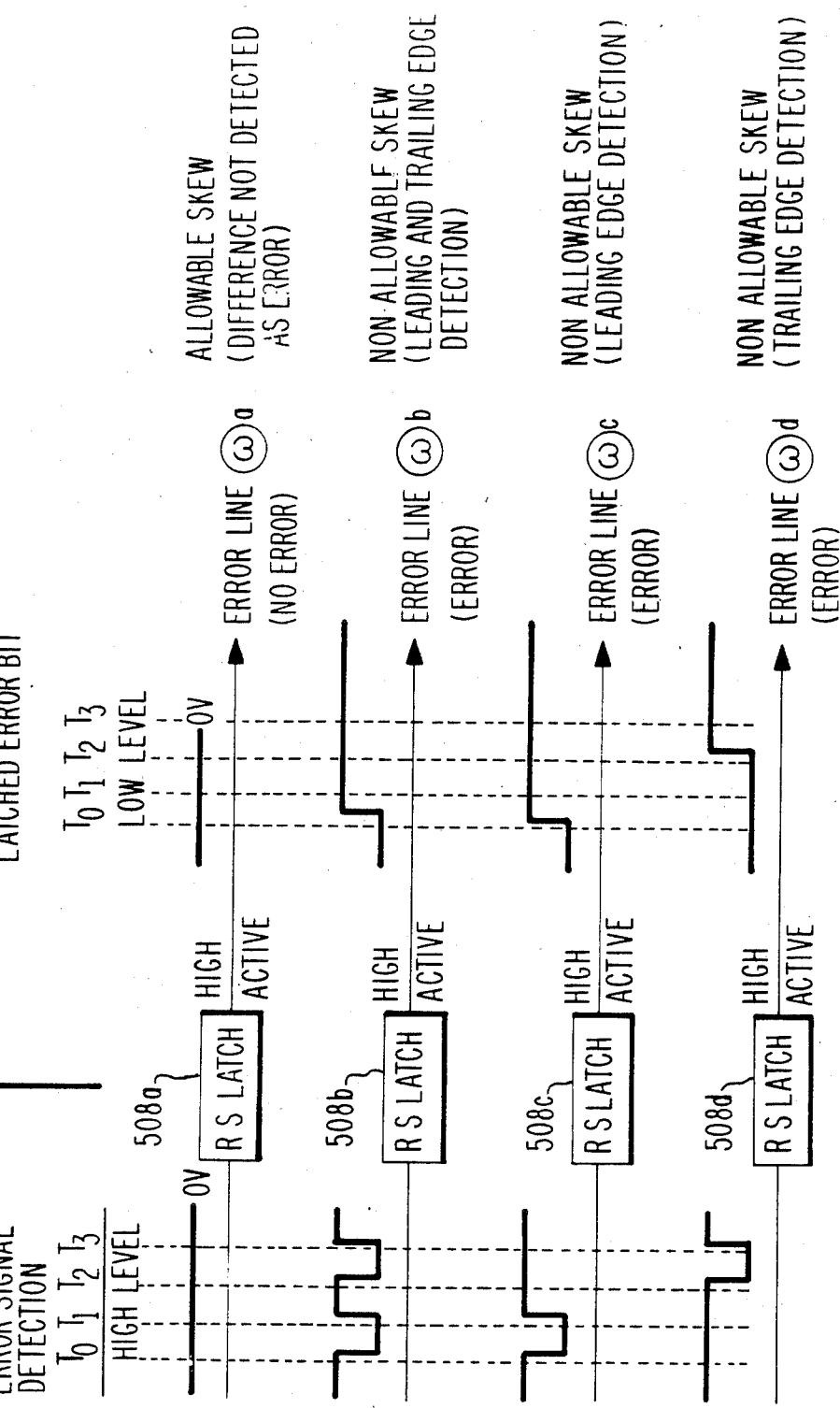
FIG. 2B. ERROR SIGNAL DETECTION

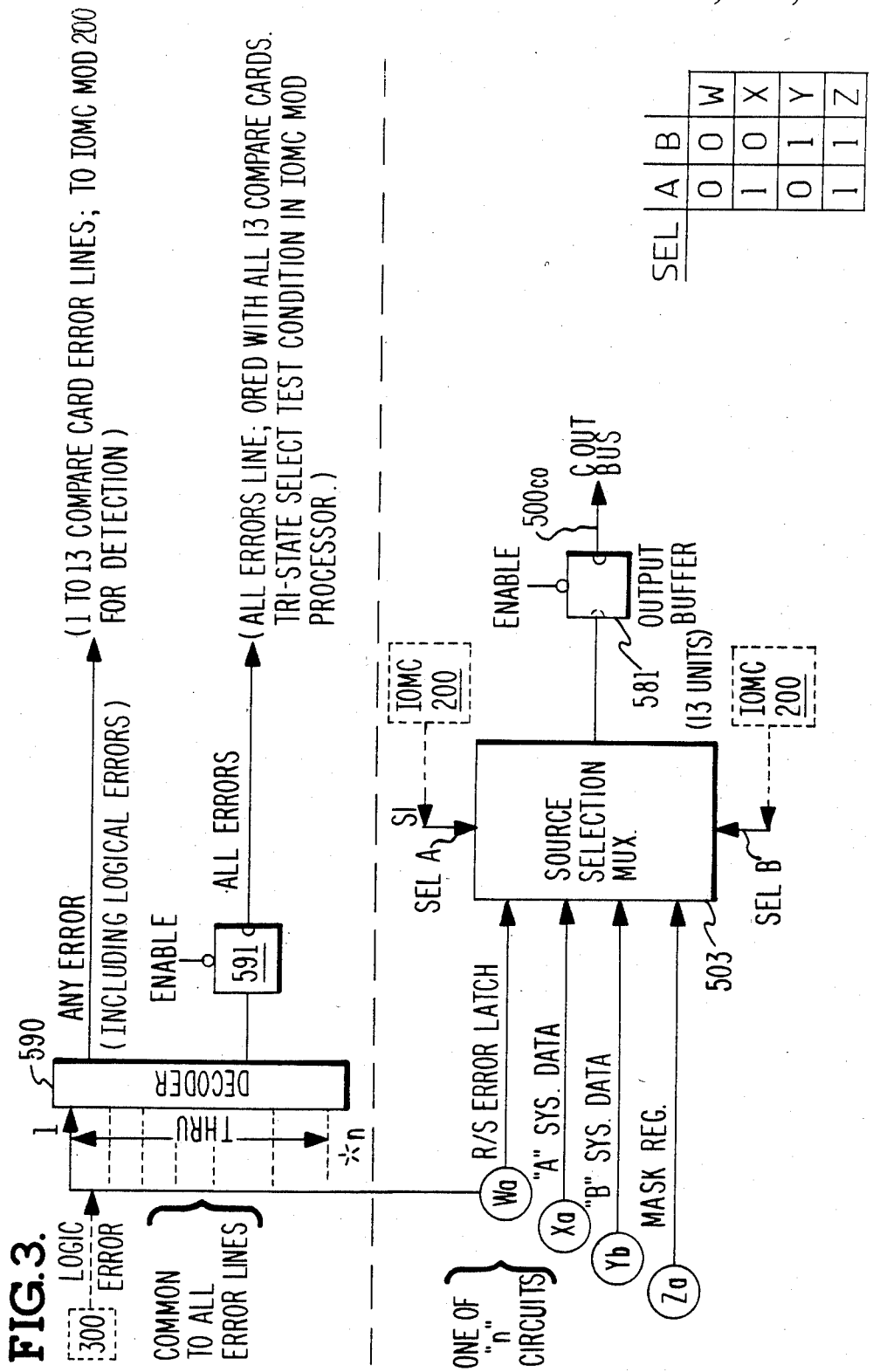

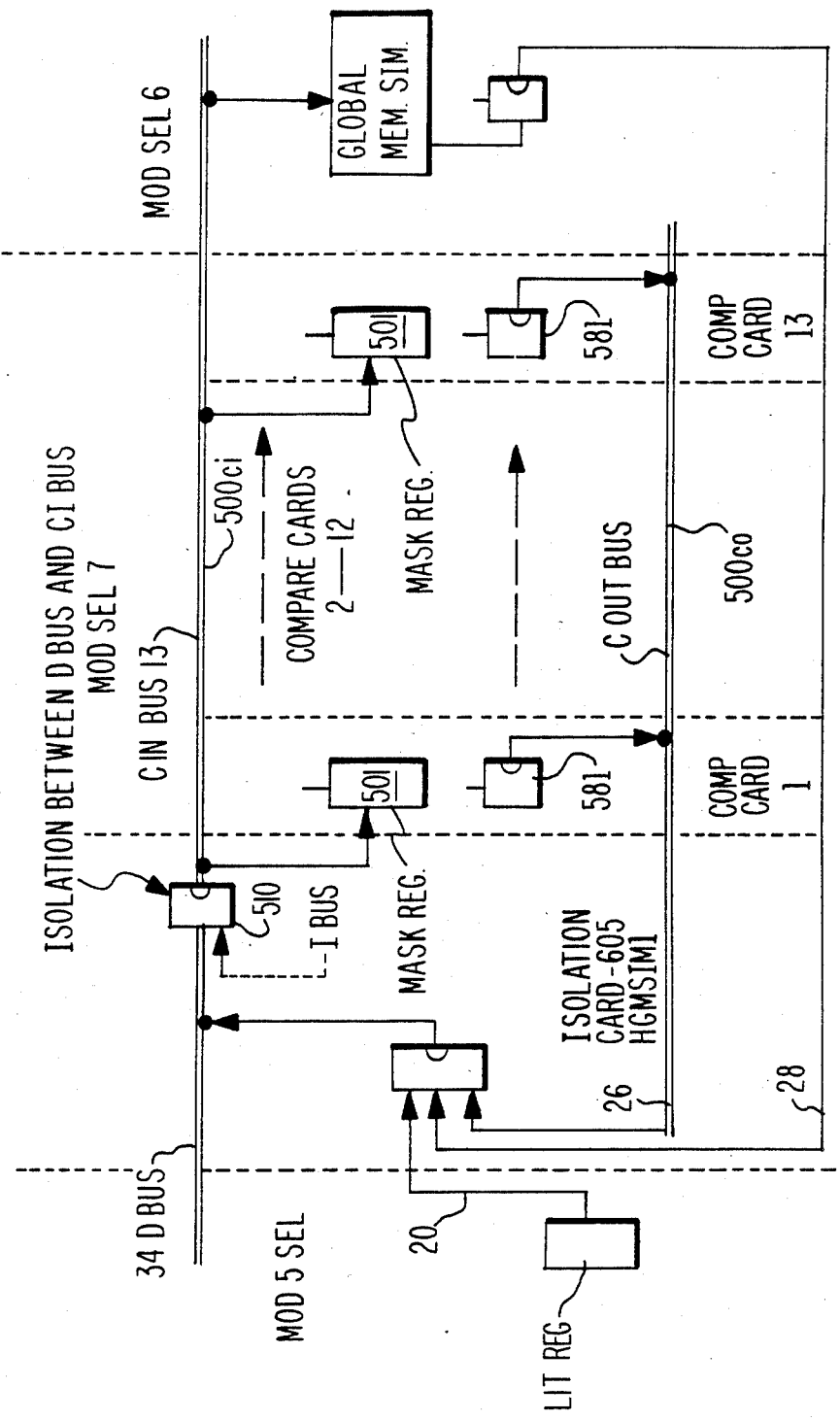
FIG. 4. COMPARE CARD SELECTION (IS IBUS 19:4 DECODED)

SELF TESTING DETECTION SYSTEM FOR COMPARING DIGITAL SIGNAL TRANSITION TIMES

FIELD OF THE INVENTION

This disclosure relates to circuitry for comparing and evaluating digital signals especially as to the times of event-transition (low-high or high-low) as between two digital signals.

CROSS REFERENCES TO RELATED APPLICATIONS

This disclosure is related to an application entitled "Adjustable System for Skew Comparison of Digital Signals", inventors James B. Whitacre and Peter P. Binoeder, filed Nov. 14, 1983, as U.S. Ser. No. 551,081.

BACKGROUND

Test systems for dynamic testing of signals generated by electronic modules have been developed in the art. One such example is U.S. Pat. No. 4,092,589 entitled "High Speed Testing Circuit". This disclosure involved the application of test signals to a device-under-test and the comparison of the device's output signals against computer-predicted signals.

The present disclosure involves a test system for digital signals where comparison is made between signals developed from a unit under test with signals from a standard reference unit, and various parameters in the testing are rendered adjustable to suit the operator's purposes.

SUMMARY OF THE INVENTION

It is an object of the present invention to provide a self-testing skew comparator circuit for comparing low-high and high-low event transitions as between two digital signals and whereby the deviation or "skew" may be converted to signals which can be sensed to indicate whether the skew is allowable or not allowable.

The skew comparison circuit is provided with a common clocking means which clocks a first and a second digital data input signal and also provides a self-test circuit having two phases known as a "pass-phase" and a "fail-phase". In the pass-phase the self test circuit is also clocked by the common clocking means and provides a digital signal having an allowable skew or "skew window" which is deemed within the allowable limits of deviation between the two signals, that is to say, the untested signal and the standard reference signal. This skew window is passed through the skew comparator circuit in order to check out and see that the skew comparator circuit accepts the skew as an acceptable signal comparison.

The fail-pass test sets up a digital signal which has a skew of sufficient magnitude to be considered a failure. When this signal is compared in the skew comparator circuit, the circuit must recognize this as a failure and indicate an error signal to indicate this checkout.

Thus, the self testing circuit can operate to check out the "pass test phase" and the "fail test phase" in order to verify the circuit operation.

The common clock circuit also provides a strobe signal which is carried through two separate paths. In the "pass delay" path, the strobe is adjustably shifted to form a digital pulse which is within the allowable skew. The strobe is also carried through an adjustable "fail delay" circuit which provides a digital pulse having a large deviation (non-allowable deviation) in its skew when compared to the standard reference signal. The pass digital signal and the fail digital signal are fed to a select multiplexor whereby an I/O maintenance controller can select either the pass signal or the fail signal and feed it to the skew comparator circuit in order to check out its proper operation.

The skew comparison circuitry of the system is duplicated for each pair of digital signals to be compared so that if the system permits up to 26 pairs digital signals to be tested, then there will be provided 26 separate skew compare circuits. Each of these skew compare circuits provides an output to an error logic circuit 509, FIG. 1, which uniforms an I/O maintenance controller processor 200 of the results.

A mask register means receives instructions from the I/O maintenance controller processor 200 when only certain selected pairs of digital data lines are to be compared rather than the standard routine of comparing all 26 pairs of lines.

BRIEF DESCRIPTION OF THE DRAWINGS

FIG. 1B is a diagram showing more detailed circuitry for a system for comparing first and second incoming digital signals and for a self-test checkout of the circuitry.

FIG. 2A is a drawing showing the conversion of time differences (skew) into digital and analog signals for sensing for an amplitude detector.

FIG. 2B is an extension of FIG. 2A to indicate how error signal detection is converted to form output signals which indicate an allowable skew error or a non-allowable skew error.

FIG. 3 is a block diagram whereby data from the digital data comparator circuitry may be transferred back to an input/output maintenance processor or maintenance controller module for action or display of the resultant data.

FIG. 4 is a schematic drawing of a series of compare card units, each of which involves similar circuitry for comparison of different sets of incoming digital data signals.

GENERAL OVERVIEW

A complex digital electronic module having many digital output signals may be tested by using a main bus (FIG. 1) $M_a$ to carry-off these digital signals for comparison with a standard reference electronic module which also has a main bus $M_b$ which provides an analogous digital signal comparable to each signal line of the module under test.

A maintenance processor 200 and common clock means (601, FIG. 1B) can be used to initiate test operations using the skew comparison and self test circuitry described herein. Thereafter, the processor can receive data from the test to analyze and pinpoint discrepancies, errors, or other diagnostic material.

DESCRIPTION OF PREFERRED EMBODIMENT

Figure 1:
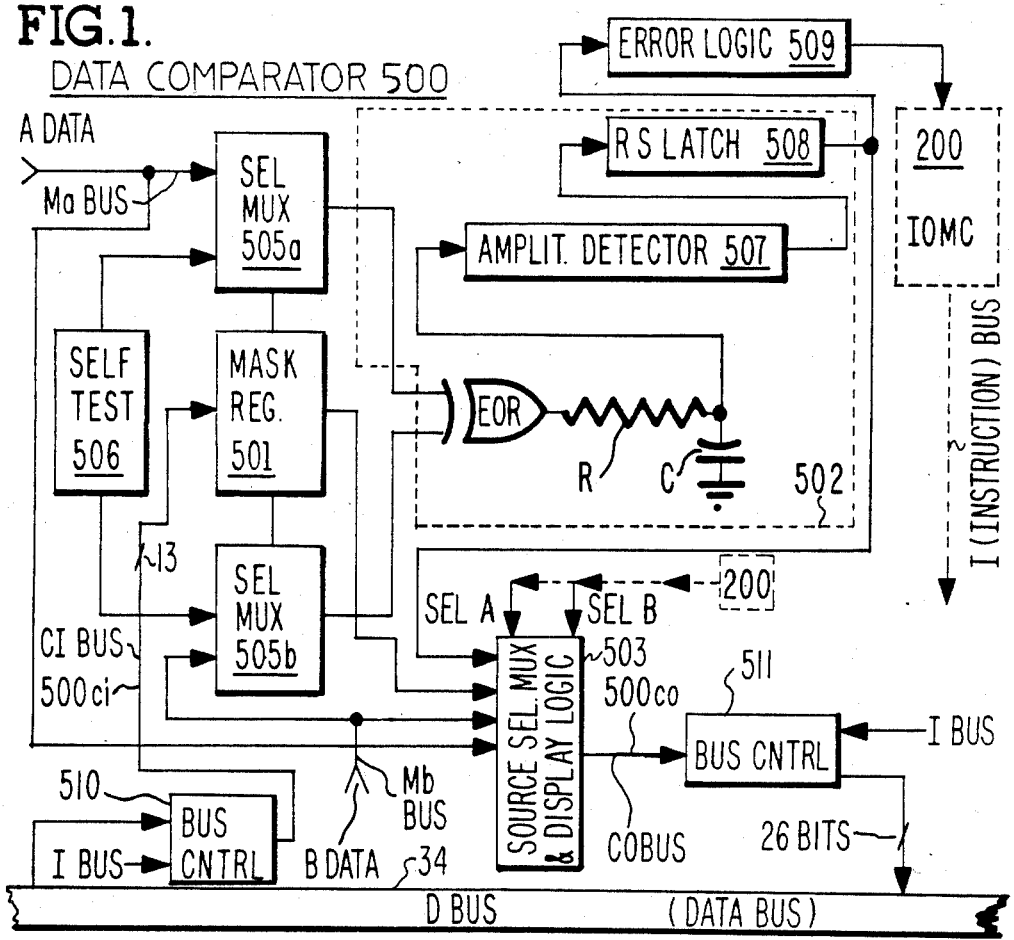
FIG. 1 is a block diagram of the elements of a digital signal testing system.

The data comparator of the present disclosure is shown in its basic format in FIG. 1. There are two sets of data, set A and set B, which are to be compared with each other. For example, 26 lines form a set of data which can be called A data or data from device A. It is desired that this data be checked out against and compared to some standard set of data from a device called device B. Thus, here again we have 26 lines forming a bus of data coming from the device B.

The lines of A data and the lines of B data are fed to selector multiplexors designated as $505_a$ and $505_b$ and the outputs of these multiplexors are fed to a circuit 502 which is an adjustable skew-compare logic circuit having an output presented to amplitude detector (Schmitt trigger) 507.

The selector MUX (505A and 505B) operates as a switching device whereby at certain times the circuit may be tested by outputs from the self tester 506; and in normal operation the selector multiplexors $505_a$ and $505_b$ are used to enable the comparison of data from device A and device B.

A mask register 501 connects to the select multiplexors in order to blank out any desired and selected input lines which are fed to the select multiplexors $505_a$ and $505_b$. The mask register 501 has an input designated as CI (comparator input) bus $500_{ci}$ which carries the bus control signals from bus control unit 510 which connects to the D or data bus 34.

The amplitude detector 507 provides output signals to a RS latch 508 (reset-set) which connects its output signal to an error logic unit 509 which then provides its signals to a maintenance processor 200 whereby the error signals can be identified. The error logic unit 509 is further described in FIG. 3.

The bus lines of the A data and the B data are fed to a display logic unit 503 which also has inputs from the mask register 501 and the RS latch 508. The source selection multiplexor and display logic 503 of FIG. 1 is seen to receive input lines which can signify an error signal or which can signify a blanking signal from the mask register 501 or which can select data lines from the A data and the B data sources. The selection of inputs is done by instructions from the processor 200 through lines designated as select A and select B shown in FIG. 3. The display logic 503 provides a bus of 26 lines as output and is designated as the comparator output bus CO bus $500_{co}$. The output of this bus $500_{co}$ is fed to bus control unit 511 which provides an output to the main data bus 34 which data can then be fed to a terminal for observation by the operator of the system.

The mask register 501 has output lines shown in FIG. 1 as feeding to the select multiplexor $505_a$ and $505_b$. Thus, the mask register can receive instructions from the maintenance controller processor 200 whereby any given pair of signals from the A system data and the B system data can be "blanked out" as required. Thus, if the A data and the B data source are only units which involve 10 pairs of signals, the program in the processor 200 can instruct the mask register to blank out the unnecessary input signal lines and only use the required signal lines.

Figure 1A:
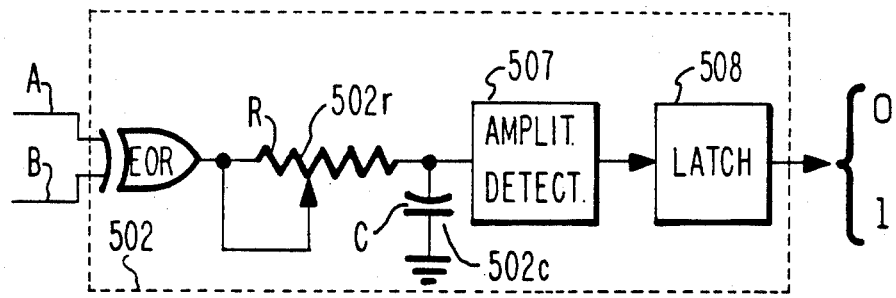
FIG. 1A is a schematic drawing showing the adjustable skew compare circuitry for comparing incoming digital signals A and B.

The skew compare logic unit (502 of FIG. 1) is shown in FIG. 1A whereby each line of the bus data from device A and each line of the bus data from device B are fed to their own separate exclusive OR gates typified by 502. For example, a typical situation would be where a bus line from device A and its analogous bus line from device B would be fed to a single exclusive OR gate designated $502_a$ in FIG. 2A. The output of the gate $502_a$ is then conveyed through resistor $502_{ar}$ and capacitor $502_{ac}$ into a threshold input unit $507_a$ which is basically an amplitude detector as was described in connection with FIG. 1. The output of the amplitude detector $507_a$ is then fed to a latch $508_a$ (FIG. 2B) which is used to temporarily hold the data for further use.

The skew compare logic unit of FIG. 1A is made to have an adjustable RC time constant so that it is possible to compare the time points of the leading edges and the trailing edges of the comparable data line signals from device A and device B.

Since the RC time constant is made adjustable, it is possible to vary the skew measurements between any of the two comparable signals from device A and device B.

The "skew" involved here may be defined as (in the situation where two signals are being compared as to the occurrence of a change which may be called a signal event) the time difference between analogous events between two signals being compared. Thus, the timing difference between the analogous signal events or transition-changes would be known as the "skew". For example, if two signals are being compared for a 0-1 transition and the first signal has this event occur at time $t_0$ and the second signal has this event occur at time $t_1$, then the difference between the two times of $t_0$ and $t_1$ is the measurement of the "skew" as to those signal events.

In the skew compare logic unit of FIG. 1A the amplitude detector $507_a$, FIG. 2A, is a Schmitt trigger which is provided with a threshold voltage such that no output will be registered unless the threshold voltage is met or exceeded. This insures that when the "skew" is considered beyond the level of acceptability, only then will the Schmitt trigger operate to produce an output signal which will generate an error condition to the latch $508_a$.

Further details and operative features of the data comparator module are explained and shown in connection with the following FIGS. 1B, 2A, 2B, 3 and 4.

A series of comparator cards (as elements 1 through 14, FIG. 4) are used to provide the various functions shown in FIGS. 1, 2 and 3. The comparator cards provide the following functions:

(a) They provide a self test function to check the adjusted skew window with the generation of a "pass delay" test circuit and a "fail delay" test circuit as shown in FIG. 1B. The pass test circuit sets up a skew timing which must pass all of the skew compare circuits in order to validate the system operation.

The fail delay test circuit sets up a skew period which every circuit sees as a failure. This is a system whereby assurance is made that the skew compare logic unit of FIG. 1A is functioning accurately. This particular set of pass-fail tests is executed in the self test mode function for every single compare card in the system, and is initiated by an I/O maintenance processor-controller designated as IOMC 200 in FIGS. 1 and 3.

Both the pass delay test circuit $620_p$ and the fail-delay test circuit $630_f$ include adjustable taps whereby the digital signals 620 and 630 (FIG. 1B) can be adjusted as to duration and also as to the timing of the low-high transition and the high-low transition moments.

(b) The comparator cards of FIG. 4 have the ability to mask any two bit pair combination on all of the compare circuits. There are 13 mask register flip-flops on each compare card which are used for masking 26 data lines. The mask register bit 0 will mask the data lines 0 and 1. Similarly, the mask register bit 12 will cause the masking of data lines 24 and 25.

(c) A selection of data from either the device of system A or the device of system B can be directly routed to the D bus 34 of FIG. 1 and routed to another module called the event module (not shown) whereby certain analytical procedures can be used to gather information about the data. The event module provides a clock counter, synchronous counter and other units which can be used for these purposes.

The testing system described herein uses two basic types of compare cards (FIG. 4). There are four foreplane compare cards in the tester unit and nine backplane compare cards in the tester unit. It is these cards which make up the data comparator module 500 of FIGS. 1 and 4. These units are provided as slide-in cards which slide in to connect to a backplane. The data from system device A and system device B is generally routed by means of flat ribbon cables where it is then either directly connected to the foreplane comparator cards or else is connected through an interface card to the backplane compare cards in the testing system.

For example, if it is desired to test the M bus (main bus) from device A in order to compare it to the M bus from device B, the data is compared during read and write operations. During the M bus turnaround (from read to write or vice versa), an external control module (not shown) will cause an "automatic signal disabling". This external control module uses an asynchronous clear line to the R/S latches 508 on the compare cards. In FIG. 1B there is shown the asynchronous clear line which connects to the RS latch $508_a$. Thus, any tri-state "glitching" is therefore not latched or captured as an error signal.

As seen in FIG. 1B there are the main buses which carry many lines of data both from device A and from device B. If, for simplicity sake, a single signal line from device system A is used to compare to its analogous same system line from device B, it is possible to illustrate what is done for all the comparable lines which are to be compared. For example, in FIG. 1B, analogous lines from device A and device B are entered into a buffer $500_b$ which is used to isolate these signals from the input. The output of the buffer $500_b$ is routed to the data selection MUX 505 and also to a point designated $X_a$ for system A and $Y_b$ for system B. These outputs $X_a$ and $Y_b$ are indicated later on FIG. 3.

The data multiplexor 505 accepts data from system input A and system input B on its inputs designated 1B and 2B respectively. The other inputs designated 1A and 2A are the "self-test" data lines which use the pass delay test $620_p$ and the fail delay test $620_f$ for self test purposes in the system.

In order for the multiplexor 505 to pass the system data through the multiplexor, then the select line shown at the bottom of 505 must be in the "high" condition (equal to 1). When in the low condition (equal to 0), then the "self-test" data is passed through the multiplexor 505.

Data passed through the multiplexor 505 can be enabled or disabled with the output control line $501_c$ whose source is a mask flip-flop 501. The set and reset data to the mask flip-flop 501 comes from the CI bus $500_{ci}$. This is the comparator input bus and is designated $CIbus_n$ to indicate that each line of the bus has a separate mask flip-flop ($501_1$, $501_2$, $501_3$, etc.) which is used to control each separate data multiplexor 505 ($505_1$, $505_2$, etc.) in the system.

Each mask flip-flop $501_{1, 2, 3}$, etc. operates its own data multiplexor $505_1$, $505_2$, $505_3$, etc.

Each mask flip-flop 501 drives two data multiplexor output control lines which are seen in FIG. 1B as the control line $501_c$ and the control line Z. This enables the effective control of two data compare circuits. The line designated Z is seen in FIG. 3 as the mask register input to the source selection multiplexor 503, FIG. 3.

There are 13 mask flip-flops (such as 501 in FIG. 1B) on each backplane compare card which control 26 compare circuits. Similarly, there are 13 mask flip-flops (such as 501 of FIG. 1B) on each foreplane compare card controlling 26 compare circuits.

Each compare card (items 1–13 of FIG. 4) has common "self-test logic" which is indicated in FIG. 1 at self-test element 506.

Referring to FIG. 1B, there are seen strobe signals designated 610, 620 and 630 over a set of timing moments $T_0$, $T_1$, $T_2$, $T_3$ and $T_4$. This strobe is originated from a clock card 601 shown in the dotted block of FIG. 1B. The strobe is a 100 nanosecond square wave which occurs during each clock period and is istributed to each of the compare cards. It is a pulse that is used to measure the skew of the compare circuits during the "self-test" mode.

Again in regard to the use of the concept of "skew" here, it should be indicated, as before mentioned, that this is the time period between the occurrence of two analogous signal events. In this particular case, it involves a time comparison of signal events emanating from a system device A and a system device B to see how they compare in their timing occurrences.

In FIG. 1B the strobe signal 610 is connected to three places; (a) the pass delay test unit; (b) the fail delay test unit; and (c) the line 1A on the data multiplexor $505_d$.

The "pass delay" output unit $620_p$ has a delay to the time $T_f$ in reference to the strobe 610 which starts at $T_0$. The "fail delay" unit $630_f$ has, as shown in FIG. 1B, a delay to the time $T_1$ in reference to the strobe 610 which starts at $T_0$. The pass delay unit and the fail delay unit are adjustable via delay line taps and are selected according to the particular skew that is deemed allowable for a particular compare card.

The "self-test" is initiated by the maintenance processor IOMC 200 of FIG. 1 and it is executed automatically on power-up or on demand of the maintenance processor IOMC 200. A failure detected after self-test is reported to IOMC 200.

In the self-test mode, initiated by the self-test unit 506 of FIG. 1 as a result of instructions from IOMC 200, an external module (designated as the input output maintenance control module, IOMC 200) can select the pass delay mode unit or the fail delay mode unit by means of the test select logic $505_s$ of FIG. 1B. The output of select logic 505 is carried over as input to the data multiplexor 505, FIG. 1B in order to select either the pass delay strobe 620 or else the fail delay strobe 630 in order to check out the operation of the skew compare logic 502.

The strobe 610 of FIG. 1B is carried as input to 1A of data multiplexor 505 while the output of the select multiplexor 505 is carried over as the input 2A to the data multiplexor 505.

Continuing with FIG. 1B, the data multiplexor 505 output has an "A" line and a "B" line which are fed as input to the exclusive OR gate $502_a$. This OR gate is one of "n" circuits which are provided for each one of the analogous lines from device A and device B which are to be compared. The exclusive OR gate $502_a$ is fed as input to a resistor R designated as $502_{ar}$ and this output constitutes the "difference" between (a) the signals 610 and 620 (pass delay) or (b) the signals 610 and 630 (fail delay) depending on whether the pass delay unit or the fail delay unit was selected.

As will be seen in FIG. 2A, the difference in pulse width is the time period which is allowed to charge capacitor C ($502_{ac}$) through the limiting resistor R ($502_{ar}$).

If the time difference period is too short, then the capacitor C cannot charge fast enough to reach an amplitude sufficient to fire the threshold which is set on the amplitude detector $507_a$, and thus no output signal from detector $507_a$ will occur.

As in the case of the self-test using the "fail delay" unit $630_f$, here the pulse width is wide enough to give capacitor C enough time to charge long enough in order to reach an amplitude which the amplitude detector $507_a$ can respond to, as seen in FIG. 2A at amplitude detector $507_b$. In this case, the amplitude detector $507_b$ will fire and set the RS latch $508_b$ (FIGS. 1B and 2B) after which the output signal is routed on to the input W on FIG. 3.

It will be noted that FIGS. 2A and 2B provide a unitary drawing where the right hand margin of FIG. 2A coincides with the left hand margin of FIG. 2B in order to make a complete drawing of illustrations showing the system compare signal operations.

As will be seen in these figures, there is an illustration of how comparisons are made between any two analogous lines from device system A and device system B. Depending on the number of analogous lines to be compared, this will establish the number "n" of similar circuits which will be used in the system.

As seen at the leftmost column of FIG. 2A, there is a time comparison indicated between the analogous signals from system A and system B which signals are fed into the A and B inputs to exclusive OR gates $502_a$, $502_b$, $502_c$ and $502_d$. For example, in FIG. 2A, and comparing the inputs A and B to exclusive OR gate $502_a$, it will be seen that the signal from device A can be compared to the reference signal from device B and it will be noticed that the leading edge of the A signal and the trailing edge of the A signal fall within the leading edge and the trailing edge of the reference B signal. The output of exclusive OR gate $502_a$ will thus provide a first pulse at time $T_0$ and a later pulse ending at time $T_3$. These can be called "digital difference" signals, and these are applied through the resistor R ($502_{ar}$) in order to charge the capacitor C ($502_{ac}$). The amplitude detector $507_a$ has been, for example, set to require a threshold voltage of 2.3 volts. And in this case the separation between the pulses starting at $T_0$ and ending at $T_3$ will be insufficient to develop the required 2.3 volt minimum voltage and no output signal will be triggered from the amplitude detector $507_a$ and thus no voltage output signal will be developed from the RS latch $508_a$ (FIG. 2B) and thus the output line (FIG. 2B) of $W_a$ will not signal an error signal and will indicate that the skew is "allowable".

Now, observing the exclusive OR gate $502_b$ in FIG. 2A, it will be seen that the signal from system device A has its leading edge occurring at a time delay later from the leading edge of the reference signal from system B. Likewise, the trailing edges of A and B involve a time delay (skew). The result of this is that output from the exclusive OR gate $502_b$ will now sufficiently charge the RC circuit to provide an amplitude greater than 2.3 volts, which will trigger the amplitude detector $507_b$ and which will cause the RS latch $508_b$ to provide an output voltage which signals an error signal or "non-allowable" skew at the output $W_b$ (FIG. 2B). Likewise, in exclusive OR gates $502_c$ and $502_d$ it is seen that the difference in event occurrence or "skew" are such that the RC circuit is sufficiently charged to trigger the amplitude detectors $507_c$ and $507_d$ which in turn cause a latching of $508_c$ and $508_d$ which provide an error signal output indicating non-allowance skew on the lines $W_c$ and $W_d$.

In FIG. 2A, the second column indicates the "digital difference output" as a result of the "skew" between the two signals and the third column is designated the "analog difference ramp" which indicates the charge developed on the capacitor C. The charge on the capacitor C is dependent upon the value of C and also the value of the resistor R in addition to the pulse widths involved.

Since, in this preferred embodiment, it is designed with a 2.3 volt threshold charge required on capacitor C in order to fire the amplitude detector 507 in order to trigger an error signal, then it is seen that the adjustability of the R and C unit values is part of the capability for selecting when the error signal or "non-allowable" skew will be triggered and when it will not be triggered.

In the preferred embodiment, the value of the capacitor C is maintained at a standard reference value for all the capacitors C (plus or minus 1%) in all the compare circuits. However, the value of the resistor R is made variable and can be adjusted in each of the n circuits and this value will govern the charge on the capacitor C for any given digital difference signal shown in column 2 of FIG. 2A.

For example, if a main bus (M bus) set of line signals from a system device A is to be compared with the M bus signals of a standard reference system device B, the R value can be set at 1100 ohms. And this will allow skew between the two systems (analogous signal lines from system A and system B) up to 100 nanoseconds to be passed as "no error". Since buses have many more switching transients which it is not desirable to be specified as "errors", therefore this permits a wider skew window in order to pass these signals without unneeded error signals.

For example, if it is desired to use the skew comparator system with another unit called a stored logic control and the stored logic control requires that the allowable skew be 40 nanoseconds or less, then in this case the value of resistor R would be set at 360 ohms. In this manner the comparator circuitry can be optimized and adjusted to deal with any pair of analogous lines for checkout purposes.

In FIGS. 2A and 2B the three lower circuits designated b, c, d show "skew differences" that are designated as errors or failures. It may be noted that the RS latch 508 gets set the very first time that the error occurs and will stay set in that condition until an external module (IOMC module 200) resets the RS error latch. The output of any or all error latches (508, FIG. 2B) will trigger a line to the external module (IOMC module 200) which in turn will initiate its own error handling routines which are useful for indicating on a display or printing out data which will be available to an operator who can read and understand what errors are taking place. Thus, each compare card of FIG. 4 has its own particular error line connected over to the external unit (IOMC module 200).

In FIG. 3 there is illustrated a circuit which is actually duplicated n times, or once for each of the 13 compare cards (FIG. 4).

Referring to FIG. 3, it will be seen that the various output lines $X_a$, $Y_b$, Z and $W_a$ (which are output lines shown in FIG. 1B) are directed as input to a source selection multiplexor 503, as also seen in FIG. 1. There are actually 13 such source selection multiplexors ($503_n$) for the 25 or 26 bits of data on each one of the compare cards.

As seen in FIG. 3, the select A and the select B lines to the multiplexor 503 make up the source selection for the "n" nunber of RS error latches 508 (FIGS. 1A, 2B), for the $X_a$ data from system device A, for the $Y_b$ system data from the system device B, or the Z output of each of the mask registers, whereby the source selection multiplexor 503 provides an output to an output buffer 581. The signals for select A and select B originate from an external module known as the input/output maintenance control module 200 and particularly in that module's switch register.

In FIG. 3 the output buffer 581 places the data contents (which have been selected by the multiplexor 503) onto the comparator out bus COUT BUS $500_{co}$. During any one clock period, only one of the 13 comparator cards can be selected to drive the comparator output bus $500_{co}$, since this bus is shared by all of the compare cards. The data on the comparator output bus can be conveyed to the maintenance processor IOMC 200 for analysis.

Again referring to FIG. 3, the output on the $W_n$ line (=$W_a$, $W_b$, $W_c$, $W_d$, etc.) from the RS error latches $508_n$ are also routed to an error line decoder 590. The circuitry includes "n" number of these decoders for each pair of analogous lines from system A and system B. Each compare card checks for "any error" or "all errors" as information output.

The "all errors" line is used to sense the self test routine to detect conditions during "fail delay" testing where each of 13 skew comparators must indicate an error signal to show that the system is operating properly.

The "any error" line is used in normal operations to indicate the detection of non-allowable skew (error signal).

The "all errors" line is tri-state selectable while the "any error" signal has a separate line from each compare card to the external module (IOMC 200) for error reporting.

It may be noted that it is not necessarily critical to know when the RS error latch $508_n$ (FIGS. 1, 1A) was set. This is so because the "any error" line from the 13 compare cards is ORed together in the external module (IOMC 200). This ORed signal is used for error detection and routed to a test point for observation by the technician-operator.

Thus, during a failing loop, the monitoring technician can spot the error line with an oscilloscope and relate the actual failure time to the logic being tested. The IOMC 200 has a "paddle" to which the technician may connect an oscilloscope.

In FIG. 4 there is shown the routing of the CI bus $500_{ci}$ and the CO bus $500_{co}$. There is also shown an isolation card located in a module designated HGMSIMI which serves as isolation for the comparator-in bus and the comparator-out bus in terms of isolating these buses from the data bus 34.

There is also instruction bus (I bus) isolation and miscellaneous control which is provided for the comparator module.

The comparator input CI bus $500_{ci}$ is 13 bits wide and services 13 mask flip-flops on 13 separate compare cards. Additionally, this CI bus is used for maintenance and parameter initialization by the isolation cards of the HGMSIMI 2 and 3 modules.

The comparator output bus $500_{co}$ is 26 bits wide and interfaces the output from any one of 13 selected compare cards onto the D bus 34. One of four source selections is made and is sent via the tri-state control logic 581 over to the comparator out bus $500_{co}$, which may also be seen in FIG. 3.

On the previously mentioned HGMSIMI (global memory simulation card 605) the comparator output bus $500_{co}$ is one of three sources that can be selected to drive the data bus, D bus 34. The other two sources for driving the D bus 34 are the LITERAL register shown in FIG. 4 or the global memory simulator on the isolation card unit 605.

While a specific embodiment of the adjustable system for digital signal comparison has been described, it is understood that other variations of the invention concept may also be embodied, and the invention is considered to be defined by the following claims.

What is claimed is:

1. In a mulitple line test system wherein each pair of first and second digital input signals from first and second source units are compared for skew in transition times to test whether each pair of first and second digital signals are within allowable tolerances, a multiple line-pair comparison system comprising:

(a) a plurality of comparison means, one each for each line-pair tested, each said comparison means for receiving each of said first and second digital input signals and for developing digital-difference output signals representing the time-difference beween the leading edges and trailing edges of each of said first and second digital input signals; each said digital difference output signals being transmitted to a discrete sensing means;

(b) a plurality of discrete sensing means connected for receiving each of said digital difference output signals and for generating an error output signal when said time-difference exceeds a preset value;

(c) processor means for initiating a skew self test means before each comparison in said comparison means of each line-pair of said first and second digital input signals and for receiving and identifying any of said error output signals from said plurality of discrete sensing means;

(d) common clock means for clocking each of said first and second digital input signals and for clocking said skew self test means;

(e) said skew self test means controlled by said processor means for checking the preset allowable skew tolerance and the preset non-allowable skew tolerance for each of said comparison means, said skew self test means including:

(e1) pass-delay circuit means for generating a pair of digital-pass signals for input to a select multiplexor means, said digital-pass signals having a skew differential within the allowable tolerance;

(e2) fail delay circuit means for generating a pair of digital-fail signals for input to a select mulitplexor means, said digital-fail signals having a skew differential beyond the allowable tolerance;

(f) said select multiplexor means for receiving said pairs of digital input signals, and for receiving said series of digital-pass signals and said series of digital-fail signals, and including:

(f1) select means, controlled by said processor means, for enabling passage of each of said pairs of digital input signals to each of said comparison means or for enabling passage of each of said series of digital-fail and digital-pass signals to each of said comparison means.

2. The comparison system of claim 1, wherein said fail-delay circuit means and said pass-delay circuit means include:

(a) means for adjusting the starting time and duration of each of said digital-fail signals and each of said digital-pass signals.

3. The comparison system of claim 1, wherein said sensing means includes:

(a) conversion means for converting said digital-difference signals into analog output signals;

(b) detection means for detecting when said analog output signals exceed a preset threshold value, said detection means providing said error output signal.

4. The comparison system of claim 3, wherein each of said sensing means includes:

(a) adjustment means for regulating the occurrence of said error output signal in order to set the allowable and non-allowable skew tolerances.

5. A digital signal comparison apparatus for comparing comparable pairs of digital signals from a standard reference module with a module-under-test, the combination comprising:

(a) a plurality of skew comparison circuit means wherein each said comparison means includes means for generating an error signal to an I/O maintenance processor means when tested pairs of digital signals show differences in transition times beyond a pre-set tolerance level;

(b) select multiplexor means for channeling each of said comparable pairs of digital signals to each respective ones of said skew comparison circuit means, said select multiplexor means including:

(b1) select control signal input means connected to receive select control signals from an I/O maintenance processor means;

(b2) first and second skew test signal input means connected to receive, respectively, allowably-toleranced and non-allowably toleranced digital test signals from a skew self-tested generation means;

(b3) a first plurality of data signal input means from a standard reference digital module;

(b4) a second plurality of data signal input means from said digital module-under-test;

(c) said skew self-test generation means, connected to said select multiplexor means, for providing said allowably toleranced and non-allowably toleranced digital test signals to each of said skew comparison circuit means, for testing the pre-set tolerance level sensitivity of each of said skew comparison circuit means;

(d) said I/O maintenance processor means connected to receive said error signal from said skew comparison means, and including:

(d1) means to display an error signal related to any misfunctioning of one of said plurality of skew comparison circuit means.

6. The combination of claim 5, wherein said I/O maintenance processor means initializes said skew self-test generation means, for testing each of said plurality of skew comparison means, prior to the transmittal of the said pairs of digital signals to said plurality of skew comparison means.

7. In a system for comparing digital signals from a standard reference first digital unit with the analogous digital signals from a second digital unit-under-test, the combination comprising:

(a) connection means for transmitting output signals from said first and second digital units to a select multiplexor means;

(b) a plurality of skew comparison circuit means providing at least one skew comparison circuit for each pair of analogous digital signals from said first and second digital units, each said skew comparison circuits connected to receive one pair of analogous digital signals from said select multiplexor means and wherein each said skew comparison circuit includes:

(b1) means to generate an error signal to a maintenance processor means, when first or second skew test signals indicate a misfunctioning skew comparison circuit means;

(c) said select multiplexor means operating under control of said maintenance processor means to select which digital signal pairs will be transmitted to each of said skew comparison circuit means for comparison testing or to select a series of self-test skew signals from a skew self-test generating means;

(d) said skew self-test digital signal generating means, connected to provide a series of said first and second skew test signals to said select multiplexor means, for transmitting said series of first and second skew test signals to each of said skew comparison circuit means;

(e) said maintenance processor means functioning to initiate said skew self-test digital signal generating means and including:

(e1) means to generate control signals to said select multiplexor means to sequentially select said series to first and second skew test signals for transmission to each of said skew comparison means before selecting each pair of analogous digital signals from said first and second digital units.

8. The combination of claim 7, wherein said maintenance processor means includes:

(a) means to initiate said self-test generating means to execute a series of first and second skew self-test operations one each of said skew comparison circuits.

(b) means to identify and defectively operating skew comparison circuit means using said series of first and second skew self-test signals.

9. The combination of claim 7, wherein said maintenance processor means includes:

(a) display means to identify any one of said skew comparison circuit means which generates an error signal in response to said series of first and second skew test signals.

10. The combination of claim 7, wherein:

(i) said series of first skew test signals each provide a pair of digital signals having transition times which fall within a predetermined allowable differential tolerance, and wherein;

(ii) said series of second skew test signals each provide a pair of digital signals having transition times which fall beyond said predetermined allowable differential tolerance; and (iii) wherein said maintenance processor will establish reliability of system operation by indicating "error" signals on each one of said plurality of skew comparison means after said series of second skew test signals are transmitted, and by indicating "no-error" signals on each one of said plurality of skew comparison means after said series of first skew test signals are transmitted.

11. The combination of claim 7, which includes:

(a) mask register means, connected to control said select multiplexor means, for selecting only those pairs of analogous digital signals which are necessary for the programmed requirements of the said first and second digital units;

(b) and wherein said maintenance processor means includes:

(b1) means to control said mask register means in order to determine which pairs of said analogous digital signals will be selected by said select multiplexor means.

* * * * *

UNITED STATES PATENT AND TRADEMARK OFFICE
CERTIFICATE OF CORRECTION

PATENT NO. : 4,577,318
DATED : March 18, 1986
INVENTOR(S) : James B. Whitacre and Peter P. Binoeder It is certified that error appears in the above-identified patent and that said Letters Patent are hereby corrected as shown below:

```
Col.  2, line 10, after "pairs" insert --of--.
Col.  4, line 66, change "reqister" to --register--.
Col. 10, line 24, change "invention" to --inventive--;
         line 28, change "mulitple" to --multiple--;
         line 66, change "mulit-" to --multi---.
Col. 11, line 52, chanqe "self-tested" to --self-test--.

Col. 12, line 56, change "one" to --on--;
         line 58, change "and" to --any--.
```

Signed and Sealed this

Twenty-sixth Day of August 1986

[SEAL]

Attest:

DONALD J. QUIGG

Attesting Officer

Commissioner of Patents and Trademarks